US009362937B1

(12) United States Patent
Burgio et al.

(10) Patent No.: US 9,362,937 B1
(45) Date of Patent: Jun. 7, 2016

(54) METHOD OF CALIBRATING A SAR A/D CONVERTER AND SAR-A/D CONVERTER IMPLEMENTING SAID METHOD

(71) Applicant: STMICROELECTRONICS S.R.L., Agrate Brianza (IT)

(72) Inventors: Carmelo Burgio, Bergamo (IT); Mauro Giacomini, Bergamo (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/835,110

(22) Filed: Aug. 25, 2015

(30) Foreign Application Priority Data

Nov. 26, 2014 (IT) .............................. MI2014A2031

(51) Int. Cl.
*H03M 1/10* (2006.01)
*H03M 1/46* (2006.01)
*H03M 1/12* (2006.01)
*H03M 1/80* (2006.01)
(Continued)

(52) U.S. Cl.
CPC .......... *H03M 1/1047* (2013.01); *H03M 1/1245* (2013.01); *H03M 1/462* (2013.01); *H03M 1/802* (2013.01); *H03M 1/808* (2013.01); *H03M 1/00* (2013.01); *H03M 1/0695* (2013.01); *H03M 1/12* (2013.01); *H03M 1/804* (2013.01)

(58) Field of Classification Search
CPC ....... H03M 1/00; H03M 1/12; H03M 1/0695; H03M 1/804
USPC ......... 341/120, 110, 118, 172, 155, 121, 161, 341/162
See application file for complete search history.

(56) References Cited

U.S. PATENT DOCUMENTS

| 6,424,276 B1 * | 7/2002 | Munoz ................ H03M 1/1061 341/115 |
| 2003/0227402 A1 | 12/2003 | Starzyk et al. |
| 2010/0141497 A1 | 6/2010 | Yang et al. |

(Continued)

FOREIGN PATENT DOCUMENTS

| EP | 1510009 B1 | 10/2006 |
| EP | 2169829 A1 | 3/2010 |

OTHER PUBLICATIONS

Jinguang Jiang et al: "A 12-b, 150 MHz Sample/s CMOS Current Steering D/A Converter with Gradient Error Compensation". Analog Integrated Circuits and Signal Processing. Kluwer Academic Publishers., BO, vol. 46. No. 3. Mar. 1, 2006. pp. 263-273. XP019204108. ISSN: 1573-1979. DOI: 10.1007/S10470-006-1635-4.

(Continued)

*Primary Examiner* — Joseph Lauture
(74) *Attorney, Agent, or Firm* — Allen, Dyer, Doppelt, Milbrath & Gilchrist, P.A.

(57) ABSTRACT

The present disclosure relates to a method of self-calibration of a successive approximation register-analog-to-digital converter. The method includes measuring an error value for each thermometer element of a plurality of thermometer elements and determining a mean value of measured error values. The method also includes generating a thermometer scale where each level of the thermometer scale will be an incremental sum of each value of a first subset, and each further level of the thermometer scale will be a sum of all values of a second subset plus the incremental sum of the elements of the first subset in any order. In addition, the method includes generating the output code according to the thermometer scale.

18 Claims, 6 Drawing Sheets

(51) Int. Cl.
*H03M 1/00* (2006.01)
*H03M 1/06* (2006.01)

(56) References Cited

U.S. PATENT DOCUMENTS

2012/0274488 A1* 11/2012 Kapusta .............. H03M 1/0845
 341/110
2015/0303933 A1 10/2015 Giacomini et al.

OTHER PUBLICATIONS

Cong Y et al: "Switching Sequence Optimization for Gradient Error Compensation in Thermometer-Decoded Dac Array". IEEE Transactions on Circuits and Systems II: Analog and Digitalsignal Processing. Institute of Electrical and Electronics Engineers Inc. 345 East 47 Street. New York. N.Y. 10017. USA., vol. 47. No. 7. Jul. 1, 2000., pp. 585-595. XP001100912., ISSN: 1057-7130. DOI: 10.1109/82.850417.

Kim Jintae et al: "Flexible-Assignment Calibration Technique for Mismatch-Constrained Digital-to-Analog Converters". IEEE Transactions on Very Large Scale Integration (VLSI) Systems. IEEE Service Center. Piscataway. NJ. USA., vol. 22, No. 9., Sep. 1, 2014. pp. 1934-1944. XP011557314.ISSN: 1063-8210. DOI: 10.1109/TVLSI. 2013.2279133.

Tao Chen et al: "A 14-bit 200-MHz Current-Steering DAC with Switching-Sequence Post-Adjustment Calibration". IEEE Journal of Solid-State Circuits. IEEE Service Center. Piscataway. NJ. USA., vol. 42. No. 11. Nov. 1, 2007. pp. 2386-2394. XP011195878., ISSN: 0018-9200. DOI: 10.1109/JSSC.2007.906200.

* cited by examiner $$E_j = \frac{T_j - T_{ref}}{E_{tot}} \Longrightarrow T_j = T_{ref} + T_{tot}E_j$$

$$\sum_{all} E_j = T_{tot} = N_{th}T_{ref} + T_{tot}\sum_{all} E_j \Longrightarrow T_{tot} = \frac{N_{th}T_{ref}}{1 - \sum_{all} E_j} \Longrightarrow \frac{T_{ref}}{T_{tot}} = \frac{1 - \sum_{all} E_j}{N_{th}}$$

$$INL_R = \frac{\sum_{j=0}^{R-1} T_j}{T_{tot}} - \frac{R}{N_{th}} = \frac{\sum_{j=0}^{R-1}(T_{ref} + T_{tot}E_j)}{T_{tot}} - \frac{R}{N_{th}} = R\frac{T_{ref}}{T_{tot}} + \sum_{j=0}^{R-1}E_j - \frac{R}{N_{th}} = R\frac{1-\sum_{all}E_j}{N_{th}} + \sum_{j=0}^{R-1}E_j - \frac{R}{N_{th}}$$

$$INL_R = R\frac{1-\sum_{all}E_j}{N_{th}} + \sum_{j=0}^{R-1}E_j - \frac{R}{N_{th}} = \sum_{j=0}^{R-1}E_j - R\frac{\sum_{all}E_j}{N_{th}}$$

$$T_{ideal} = \frac{T_{tot}}{N_{th}} = \frac{T_{ref}}{1-\sum_{all}E_j}$$

$$DNL_k = \frac{T_k - T_{ideal}}{N_{th}T_{ideal}} = \frac{T_{ref} + T_{tot}E_k - \frac{T_{ref}}{1-\sum_{all}E_j}}{\frac{N_{th}T_{ref}}{1-\sum_{all}E_j}} = \frac{\frac{T}{T_{ref}} + E_k \cdot \frac{1}{1-\sum_{all}E_j}}{\frac{N_{th}}{1-\sum_{all}E_j}} \cdot 1 + \frac{\frac{N_{th}}{1-\sum_{all}E_j}E_k - \frac{1}{1-\sum_{all}E_j}}{\frac{N_{th}}{1-\sum_{all}E_j}} = E_k - \frac{\sum_{all}E_j}{N_{th}}$$

Fig. 2A

METHOD OF CALIBRATING A SAR A/D CONVERTER AND SAR-A/D CONVERTER IMPLEMENTING SAID METHOD

FIELD

The present disclosure relates to a method of self-calibration of a successive approximation register-analog-to-digital (SAR-A/D) converter and a SAR-A/D converter implementing the method. Particularly, the present disclosure relates to a method of self-calibration of a mixed thermometer code-binary code SAR-A/D converter and to such mixed thermometer code-binary code SAR-A/D converter. More particularly, the present disclosure relates to a method of self-calibration of the digital-to-analog converter DAC that is part of the thermometer-code SAR-A/D converter to optimize the integral non-linearity of the analog-to-digital converter.

BACKGROUND

SAR A/D converters are known in the art to be used for analog-to-digital conversion. In this type of converter, conversion is based on a dichotomic search through all possible quantization levels to the determination of the final conversion value.

Referring to FIG. 1, which shows a block diagram of a classical SAR-A/D converter, such converter comprises a digital-to-analog converter (DAC), a successive approximation register (SAR), a sample-and-hold circuit (S/H), an input voltage Vin and a reference voltage Vref. Particularly, the sample-and-hold circuit, which may also be integrated in the DAC converter, is configured to capture the input voltage Vin, whereas the voltage comparator (Comp) which compares the voltage Vin with the output of the DAC, is configured to transmit the result to the successive approximation register (SAR), which emits an approximate digital code of the Vin to the internal DAC whose output is fed back to the comparator with an analog signal equivalent to the output digital code of the SAR to be compared with the input voltage Vin.

Particularly, binary-weighted physical elements are usually employed in the internal DAC to carry out the conversion process. For example, these binary-weighted physical elements consist of resistors, capacitors, current generators and the like.

In order to convert a voltage corresponding to the binary code '101001' (i.e. the code representing the number 41) using a binary converter having a number $N_{bit}=N_{BitBin}$ of bits equal to six, six physical elements are available. In the binary code '101001' the physical elements corresponding to the indices 0, 3 and 5 (i.e. the ones of the binary code '101001') are intended to be somehow selected and the corresponding converted voltage is 41/64 Vref, where Vref represents the reference voltage to be used for the conversion process.

However, if a thermometer-code SAR A/D converter is used, all the physical elements are nominally equal to one another. Therefore, during the conversion process, if the voltage corresponding to the binary code '101001' (41) has to be converted using a thermometer-code converter having a number $N_{bit}=N_{BitTh}$ of bits equal to six, all the physical elements, equal to 64 (because 2^6=64), corresponding to the indices from 0 to 40 are selected (whereas the physical elements corresponding to the indices from 41 to 63 are not selected) and the corresponding converted voltage is always equal to 41/64 Vref.

Conversely, in a converter having a mixed thermometer-code and binary design, the plurality of physical elements that form the converter are divided into two subsets, i.e. one subset formed by thermometer elements and the other subset formed by binary-weighted elements.

Namely, the binary-weighted elements define the LSB bits of the output code generated by the converter, whereas the thermometer elements define the MSB bits of such output code.

It shall be noted that the accuracy of the converter with the thermometer-code and binary design is set by the smallest physical element implemented in the binary elements and corresponds to 1 LSB, i.e. the bit corresponding to the zero index of LSB bits.

The example of FIG. 2 is a converter with a thermometer-code and binary design having twelve bits, with an output code organized as follows:

binary physical elements are used for indices from 0 to 5, which represent the LSB bits of the output code, which means that the 0 index is given by a binary element, the 1 index is given by a binary element having twice the value (of the binary element for the 0 index), the 2 index is given by a binary element having four times the value (of the binary element for the 0 index) and so on; and thermometer elements are used for indexes from 6 to 11, which represent the MSB bits of the output code, such that each index involves the addition of as many thermometer elements as required by the binary coding of the index weight minus 6 ($2^{(bit\ index-6)}$).

The problematic aspect of such thermometer-code ADC is that, as the latter generates the values of the various voltages $V_{thermo}$ (Thermo=0 ... $2^{N}{}_{Th}$) of the thermometer levels as used in the A/D conversion process, these voltage values V Thermo are affected by the problem that the thermometer elements are not identical, as they should ideally be but actually exhibit non-idealities, which introduce an error in such voltage values $V_{Thermo}$.

Thus, assuming that 64 thermometer elements $T_j$ are provided, the ideal voltages $V_{Thermo}$ required during SAR conversion are:

$$V_{Thermo} = \frac{V_{ref}}{T_{tot}} \sum_{j=0}^{Thermo-1} T_j$$

where $T_{tot}$ is the total value of the thermometer elements, Thermo belongs to the set from 0 to 64 and $T_j$ belongs to the set $T_0, \ldots, T_{thermo}-1$, because voltage levels are one more than the elements. Nevertheless, since all thermometer elements $T_j$ are imperfect, each having its own error $\tau_j$, then each thermometer element may be rewritten according to the formula:

$$T_j = T_{ideal} + \tau_j$$

In view of the above, the real voltage values Vthermo required during SAR conversion are expressed by the following formula:

$$V_{Thermo} = \frac{V_{ref}}{T_{tot}} \sum_{j=0}^{Thermo-1} (T_{ideal} + \tau_j)$$

Thus, the INL error between the ideal and real voltage sequences may be expressed by the following formula:

$$INL_{Thermo} = \frac{V_{ref}}{T_{tot}} \sum_{j=0}^{Thermo-1} \tau_j$$

where $INL_{Thermo}$ represents the error for the Thermo$^{th}$ level of the DAC converter.

Such $INL_{Thermo}$ depends on the order of thermometer-code errors and is inherently equal to zero for minimum and maximum voltage limits $V_{min}=0$ and $V_{max}=V_{ref}=V_{64}$ (because in this case the number of bits is supposed to be 6).

The $INL_{Thermo}$ value is affected by the measurements of the imperfection of the thermometer elements. Particularly, the calibration process as disclosed in Patent Application MI2014A000720 (which is intended to be integrated in the present disclosure), was found to be able to approximate the ideal characteristic INL with an accuracy of half the DNL error of the worst measured thermometer element.

Of course, the $INL_{Thermo}$ value is invalidated if measurements on thermometer elements are not made with the utmost accuracy.

A further problem is the area occupied by the switches that are used to switch the thermometer elements on.

SUMMARY

The object of the present invention is to provide a method and a converter for self-calibration of a hybrid thermometer-binary code SAR A/D converter.

One embodiment provides a more efficient method of self-calibration of a thermometer-code SAR A/D converter that does not require the introduction of dedicated hardware.

BRIEF DESCRIPTION OF THE DRAWINGS

The characteristics and advantages of the present disclosure will appear from the following detailed description of a possible practical embodiment, illustrated as a non-limiting example in the set of drawings, in which:

FIG. 2A shows the mathematical calculations required to check the correctness of the calibration method;

DETAILED DESCRIPTION

Even when this is not expressly stated, the individual features as described with reference to the particular embodiments shall be intended as auxiliary to and/or interchangeable with other features described with reference to other exemplary embodiments.

Parts that have been described with reference to the prior art will be designated hereinbelow, for simplicity, by the same numerals.

In view of minimizing the $INL_{Thermo}$ value without using dedicated or additional hardware, the redundancy in the actuation sequence of the thermometer elements $T_j$ is a key factor for efficient self-calibration of the SAR A/D converter.

Particularly, all the actuation sequences are equivalent (because all the elements must be identical, i.e. 64 LSB when $N_{BitBin}$ bit is equal to 6), but they are slightly different in practice, whereby any change in the actuation sequence of the elements involves a change in the output code of the ADC.

As mentioned above, the error between the ideal and real voltage sequences may be expressed by the following formula:

$$INL_{Thermo} = \frac{V_{ref}}{T_{tot}} \sum_{j=0}^{Thermo-1} \tau_j$$

In order to minimize such $INL_{Thermo}$ value a method for calibration of the SAR-A/D converter is provided.

Figure 3:
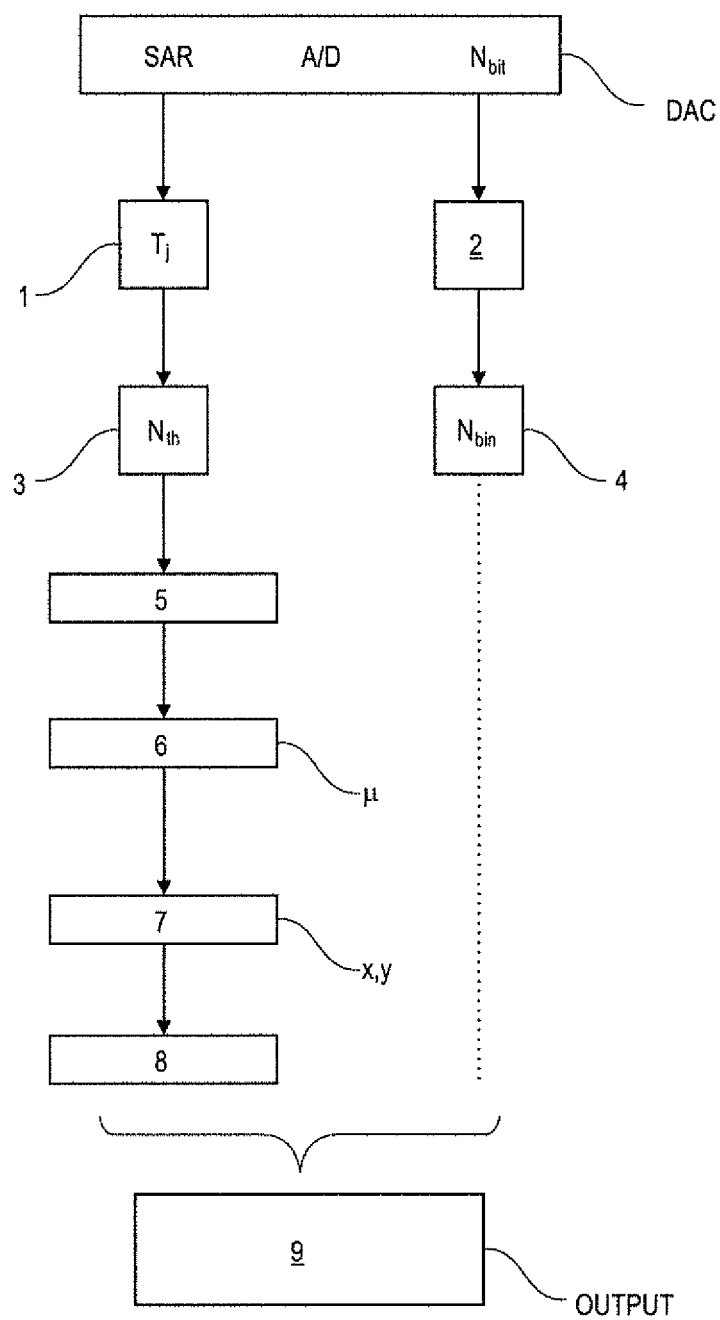
FIG. 3 is a flow chart of the method of calibrating a SAR A/D converter of the present invention.

Particularly, also referring to FIG. 3, the SAR-A/D converter comprises an $N_{bit}$-bit digital-to-analog converter DAC to generate an $N_{bit}$-bit output code OUTPUT 9.

In one aspect, the digital-to-analog converter DAC comprises a plurality of thermometer elements $T_j$, block 1, and a plurality of binary-weighted elements, block 2.

It shall be noted that, in the definition of the present calibration method, the binary part of the physical elements is assumed to be perfect, i.e. error-free and designed in optimized fashion with the available hardware technologies.

Such binary part is used for high-precision measurement of the errors $E_j$ of the thermometer elements $T_j$, possibly by means of averaging methods.

Particularly, relative differences $E_j$ may be measured using a first subconverter $C_{LSB}$ having a few bits, as the measured difference is between numbers that should have been ideally identical, but are actually similar and not coincident.

For this purpose, a first subset of thermometer elements $T_j$ is designed to be obtained, block 3, from the plurality of physical elements of the converter, such first subset defining the MSB bits of the output code OUTPUT and a second subset of binary weighted elements $N_{bin}$ is also designed to be obtained, block 4, such second subset $N_{bin}$ defining the LSB bits of the output code OUTPUT.

In one aspect, the output code OUTPUT is defined by a thermometer scale $S_{Th}$ whose number of levels $m_i$ is equal to $2^{NBitTh}$, $2^{NBitTh}$ being equal to $N_{Th}$.

Advantageously, the method includes a step 5 of measuring the error value of each thermometer element $T_j$, which is carried out with methods known to the skilled person and not described herein.

Once the error value of each thermometer element is measured, in one aspect of the method, a step is provided, block 6, for determining a mean value $\mu$ of these measured values.

When the mean value $\mu$ is known, in one aspect of the method, at block 7 the plurality $N_{Th}$ of thermometer elements $T_j$ are divided into a first subset X and a second subset Y, each containing an identical number of values x, y.

Particularly, the number of elements x, y in the subsets X and Y is half the number of the thermometer elements $T_j$. This division is made, for instance, using a software algorithm.

This is possible because the following equation is by definition always true, regardless of the measured thermometer element values:

$$\sum_{all} DNL_j = 0$$

As a result of this equality, when the thermometer elements $T_j$ are divided into the above two subsets X and Y, then:

$$\sum_X DNL_j + \sum_Y DNL_j = 0$$

i.e.:

$$\sum_X DNL_j = -\sum_Y DNL_j$$

This means that the sum of the thermometer elements x of the subset X (i.e. the INL of the subset X) is equal to the opposite of the sum of the thermometer elements y of the subset Y (i.e. the INL of the subset Y), regardless of the type of partition.

Assuming the above, then the first subset X comprises the thermometer elements $T_j$ whose values are closer to said mean value μ as long as the error of the sum of thermometer elements $T_j$ of the first subset X is not more than the error value of the element farthest from the mean value μ. The second subset Y comprises all the remaining thermometer elements $T_j$.

The allocation of the respective s values to the subset X or the subset Y is performed, for instance, by a software algorithm.

The method of the present invention includes, at step 8, generating a thermometer scale $S_{Th}$, using for:

each level $m_i$ of said thermometer scale $S_{Th}$, with i ranging from 0 to $N_{TH}/2$, the incremental sum of each value x of said first ordered subset X; and each further level $m_i$ of said thermometer scale $S_{Th}$, with i ranging from $N_{TH}/2+1$ to $N_{TH}$, the sum of all the values y of said second subset Y plus the incremental sum of the elements x of the subset X in any order.

The method also includes generating, at block 9, the output code OUTPUT according to such thermometer scale $S_{Th}$.

In a preferred aspect of the method, the first subset X is ordered such that the maximum error value $\epsilon_R$ of the integral non-linearity error INL of a $R^{th}$ thermometer level may be reduced and minimized.

Preferably, in the present method, each further level $m_i$ of the thermometer scale $S_{Th}$, with i ranging from $N_{TH}/2+1$ to $N_{TH}$, will be the sum of all the values y of the second subset Y plus the incremental sum of the elements x of the subset X in reverse order.

Figure 4:
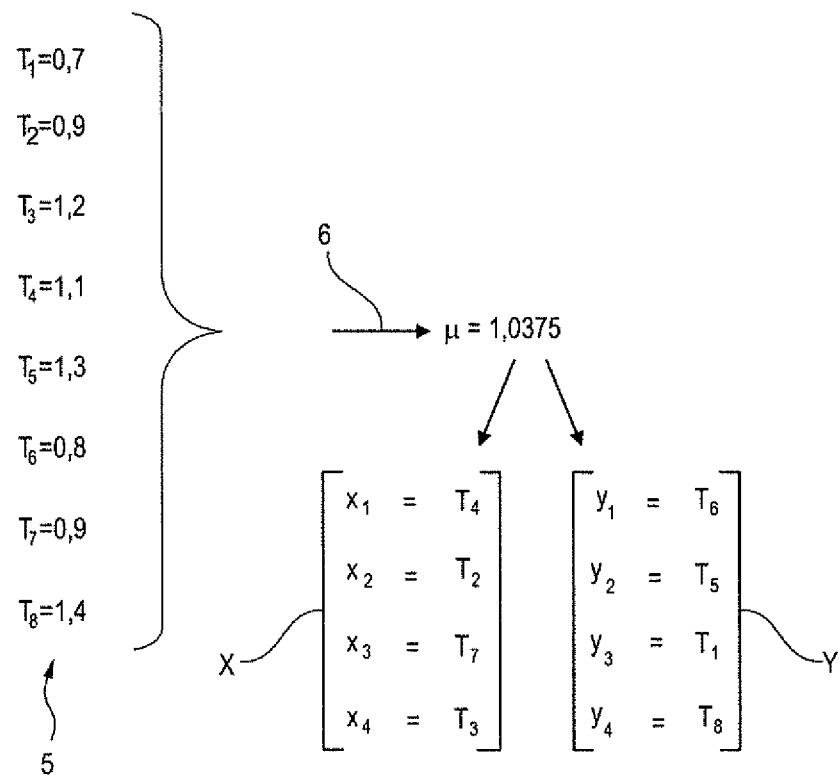
FIG. 4 shows an example of the method of FIG. 3 in graphical and numerical form.

In other words, also referring to FIG. 4, which shows a numerical example of the method of the present disclosure, it shall be noted that levels $m_5$ to $m_8$ of the scale $S_{Th}$ are constructed as the sum of all the values y of said second subset Y plus the incremental sum of the elements x of the subset X in reverse order.

Namely, assuming that:

the number of thermometer bits $N_{BitTh}$ is equal to three, then the number $N_{th}$ of thermometer elements $T_j$ is equal to eight ($2^3$ being equal to 8) such that the number of levels $m_i$ of the thermometer scale $S_{Th}$ is also equal to eight, the number of binary bits $N_{BitBin}$ is equal to three, then the number $N_{Bin}$ of binary elements is equal to three such that the number of levels of the binary scale $S_{Bin}$ is also equal to eight, then, the output code OUTPUT is defined by the thermometer scale $S_{Th}$ having a number of levels $m_i$ equal to eight, and by the binary scale $S_{BIN}$ having a number of levels equal to eight.

If this is the case, assuming that the measured values of the $N_{th}=8$ thermometer elements $T_j$ of the thermometer scale $S_{Th}$ are, for instance, equal to $T_1=0.7$, $T_2=0.9$, $T_3=1.2$, T4=1.1, $T_5=1.3$, $T_6=0.8$, $T_7=0.9$ and $T_8=1.4$, then the step of calculating the mean value μ provides a value of 1.0375, although the ideal value should have been 1.0.

Once the mean value μ is known, the subset X, after the above mentioned division step, comprises a number s of values equal to four, i.e. half the $N_{th}=8$ thermometer elements $T_j$, such values being the ones closer to the mean value μ, whereas the subset Y, which also comprises a number s of values equal to four, i.e. half the $N_{th}=8$ thermometer elements $T_j$, is filled with the values that are farther from the mean value μ.

In other words, the subset X comprises four elements x1, x2, x3, x4, and the subset Y also comprises four elements y1, y2, y3, y4, each identifying its own value Tj.

It shall be noted that the values $x_{1,\ldots,4}$ of the subset X are used individually, whereas the values $y_{1,\ldots,4}$ of the subset Y are used as a group, i.e. as a single value equal to the sum of the four values $y_{1,\ldots,4}$.

Once the two subsets X and Y have been defined, then a new thermometer scale $S_{Th}$ may be generated, such that each level from $m_1$ to $m_4$ of the thermometer scale $S_{Th}$ is associated with the incremental sum of the available values $x_{1,\ldots,4}$ of the first subset X.

Particularly, the incremental sum of each value x of the first subset X is equal to $$m_k = \sum_1^k x_j,$$

where k ranges from 0 to $N_{th}/2$ and $x_j$ represents each value stored in such first subset X.

Therefore, the term incremental sum of the values $x_{1,\ldots,4}$ is intended to mean the following:

position $m_0$ of $S_{TH}=0$;
position $m_1$ of $S_{TH}=$value x1;
position $m_2$ of $S_{TH}=$value x1+value x2;
position $m_3$ of $S_{TH}=$value x1+value x2+value x3;
position $m_4$ of $S_{TH}=$value x1+value x2+value x3 value x4.

In other words:

for the first level $m_1$ of the thermometer scale $S_{Th}$ there is a single value of the subset X, particularly the one stored in the first position $x_1$, for the second level $m_2$ of the thermometer scale $S_{Th}$ there is the sum of the values stored in the first position $x_1$ and the second position $x_2$ of the subset X, and for the third level $m_3$ of the thermometer scale $S_{Th}$ there is the sum of the values stored in the first position $x_1$ the second position $x_2$ and the third position $x_3$ of the subset X.

Each further level from $m_5$ to $m_B$ of the thermometer scale $S_{Th}$ is associated with the sum of all the values $y_{1,\ldots,4}$ of the second subset Y plus the incremental sum of the elements x of the subset X in reverse order.

Namely:

the level $m_5$ of the thermometer scale $S_{Th}$ is equal to the sum of all the values $y_{1,\ldots,4}$ of the second subset Y plus the value of the level $x_4$ of the first subset X, the level $m_6$ of the thermometer scale $S_{Th}$ is equal to the sum of all the values $y_{1,\ldots,4}$ of the second subset Y plus the value of the levels $x_4$ and $x_3$ of the first subset X, the level $m_7$ of the thermometer scale $S_{Th}$ is equal to the sum of all the values of the second subset Y plus the value of the levels $x_4$, $x_3$ and $x_2$ of the first subset X, and the level $m_8$ of the thermometer scale $S_{Th}$ is equal to the sum of all the values $y_{1,\ldots,4}$ of the second subset Y plus the value of the levels $x_4$, $x_3$, $x_2$ and $x_1$ of the first subset X.

According to a preferred embodiment of the present method, if the sum of the errors of the elements x of the first subset X is greater than the highest error of the individual elements x, then a step is provided of exchanging at least one value y of said second subset Y with an appropriate element x of said first subset X if the sum of the resulting elements is smaller than the worst of the elements of the new subset X resulting from the exchange.

For example, assuming that the measurement of the error value of each thermometer element $T_j$ has provided the following values 0.97 0.93 0.85 0.98 1.1 1.2 1.02 1.05 and that the mean value, i.e. the ideal element, is 1.0125, then the DNL of each element is −0.0420, −0.0815, −0.1605, −0.0321, 0.0864, 0.1852, 0.0074 and 0.0370.

Ordered DNLs are obtained by ordering, i.e. −0.1605, −0.0815, −0.0420, −0.0321, 0.0074, 0.0370, 0.0864 and 0.1852.

The selection of GOOD elements, i.e. those whose values are closer to the mean value μ gives elements with values −0.0420, −0.0321, 0.0074 and 0.0370 whereas the selection of BAD elements, i.e. those whose values are farther from the mean value i, gives elements with values −0.1605, −0.0815, 0.0864 and 0.1852.

The sum of GOOD elements is −0.0296, whereas the sum of BAD elements is 0.0296.

Therefore, here the DNL at half-scale is −0.0593, which is worse than all the DNLs of the GOOD elements.

Thus, an alternative selection of GOOD elements is required, with one GOOD element being exchanged with a BAD element, e.g. the third BAD element being selected instead of the fourth GOOD element, i.e.:

−0.0420 −0.0321 0.0074 0.0864

The same applies for the selection of BAD elements,

−0.1605 −0.0815 0.1852 0.0370

The INL at half-scale, which is equal to 0.0395, is found to be better than any DNL of the new GOOD elements.

This exchange provides advantages, such as making the sum of the so-called GOOD elements as close as possible to that of the so-called BAD elements, without causing the GOOD (or BAD) elements to include an element that is too far from the mean value. In fact, since the two sums are opposite to each other, it would be ideally desirable (although not achievable in practice) that both sums should be zero (i.e. that the INL characteristic at half-scale should be perfect).

In one aspect of the present disclosure, the first subset X is ordered such that the maximum error value $\epsilon_R$ of the integral non-linearity error (INL) of a $R^{th}$ thermometer level may be minimized.

In order to minimize the integral non-linearity error value ($\epsilon_R$ INL), in one aspect as disclosed in MI2014A000720, which is intended to be incorporated in the present disclosure, the method includes:

determining the error value $\epsilon_R$, (block 5), using the following formula:

$$INL_R = \sum_{j=0}^{R-1} E_j - \frac{R}{N_{Th}} \sum_{j=0}^{N_{Th}-1} E_j$$

where $E_j$ represents the relative mismatch differences between the plurality of thermometer elements $T_j$ and a reference thermometer element $T_{ref}$ selected from said plurality of thermometer elements $T_j$ and R ranges from 0 to $N_{Th}$ and represents the number of available thermometer levels.

In one aspect, the relative mismatch differences $E_j$ may be measured using the following formula:

$$E_j = \frac{T_j - T_{ref}}{T_{tot}}, T_{tot} = \sum_{k=0}^{N_{Th}-1} T_k, T_{ref} \in \{T_0 \ldots T_{N_{Th}-1}\}$$

where:

$N_{Th}$ represents the number of thermometer elements $2^{N_{BitTh}}$; and $T_{tot}$ is the total value of said plurality of thermometer elements $T_j$, which total value $T_{tot}$ may be calculated using the following formula:

$$T_{tot} = \sum_{k=0}^{N_{Th}-1} T_k = N_{Th} \frac{T_{ref}}{1 - \sum_{j=0}^{j=N_{Th}-1} E_j}$$

Figure 1:
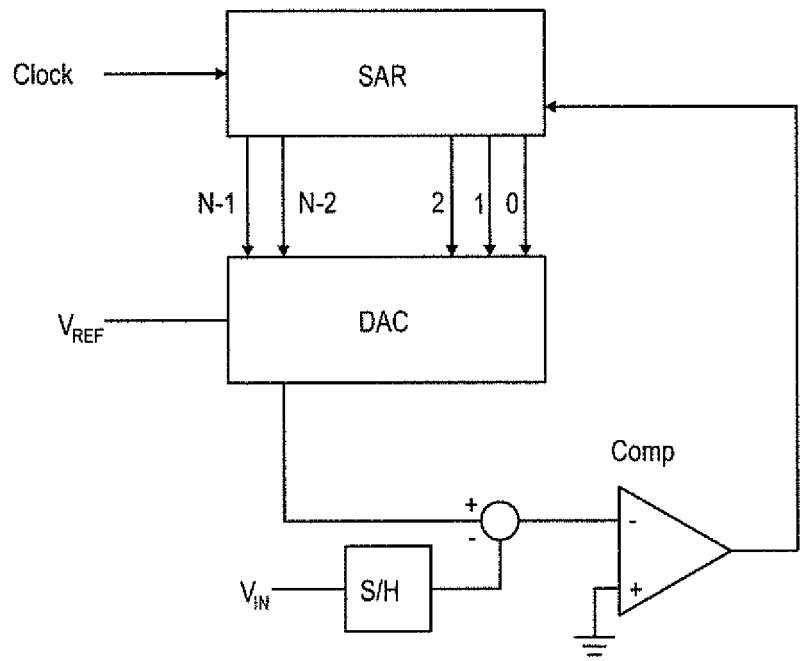
FIG. 1 shows a block diagram of a SAR A/D converter of the prior art.
Figure 2:
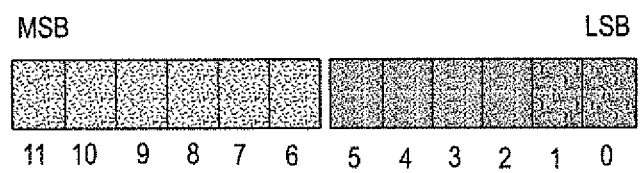
FIG. 2 shows a graphical representation of the composition of the elements of a SAR A/D converter of the prior art.

The mathematical proof of the above formulas may be found in FIG. 2A, which shows the most important steps to the definition of the error value $INL_R$.

Particularly, the FIG. 2A shows that the formula for the error value $INL_R$, i.e. the integral non linear error (INL) of a $R^{th}$ thermometer level may depend on $E_j$, i.e. on the relative differences between the plurality of thermometer elements $T_j$ and a reference thermometer element $T_{ref}$ selected from the plurality of thermometer elements $T_j$ of the digital-to-analog converter (DAC) as measured by the formula:

$$E_j = \frac{T_j - T_{ref}}{T_{tot}}$$

The differential non linearity value (DNL) may be determined (block 5) using the following formula:

$$DNL_k = E_k - \frac{1}{N_{Th}} \sum_{j=0}^{N_{Th}-1} E_j$$

In one aspect, the errors $E_j$ of the thermometer elements $T_j$ may be possibly measured by also using averaging methods.

In one aspect, in order to measure the mismatch $E_j$ of the thermometer elements $T_j$, if these thermometer elements $T_j$ are implemented as capacitors C (see FIG. 8), then there will be a step of checking an input voltage (VINC) on said input terminal of said comparator (Comp) using the following formula:

$$\Delta V = \frac{C_{thX} - C_{thref}}{\sum C} * (VrefP - VrefN)$$

where ΣC represents the sum of the thermometer elements, $C_{thref}$ is a reference thermometer element, $C_{thx}$ is the thermometer element being measured, $V_{refP}$ is a first reference voltage that is found on the reference thermometer element during sampling and on the element being measured during the step of checking, $V_{refN}$ is a second reference voltage that is found on the thermometer element being measured during sampling and on the reference element during the step of checking, and on all the other thermometer elements throughout the conversion and $\Delta V$ is the measurement of the errors $E_j$.

The above identified error $INL_R$ may be minimized by determining the appropriate actuation permutation P of the thermometer elements $T_j$ for more accurate calibration.

For this purpose, the above mentioned method step of minimizing or reducing the maximum of said integral non-linearity INL error value $INL_R$ of the Rth thermometer level, includes:

identifying the maximum of said error value $INL_R$ for each level R;

recalculating the integral non-linearity error value $INL_R$ for a number of permutations P defined beforehand; and selecting the permutation that reduces or minimizes said error value $INL_R$ from said number P of permutations.

Nevertheless, although this minimization step is effective, there still exist an excessively high number of permutations to be processed by the method, i.e., theoretically corresponding to the factorial of the number of thermometer elements, e.g. 64 in the case of a 6-bit thermometer-code converter.

Therefore the maximum absolute error $INL_R$ must be minimized without processing the 64 permutations to actuate the thermometer elements.

This may be done, for example, using a metaheuristic algorithm, such as a simulated annealing algorithm, a tabu search algorithm or genetic algorithm but also, preferably, using a deterministic approach.

In view of using a deterministic approach it should be noted that, for a "perfect" DAC converter, each thermometer element $T_j$ must have a "perfect" value, i.e. $T_{ideal}$.

If this is not the case (i.e. if the converter is not perfect), each time that the thermometer element $T_{Thermo}$ is added, the INL error should change by $\tau_{Thermo}$.

In fact, each thermometer element is affected by an error defined as $DNL_{Thermo}$ which represents, as is also shown from FIG. 2A, the differential non-linearity, i.e. the difference between the ideal analog-to-digital conversion step and the actual analog-to-digital conversion step.

In the light of the above, assuming a Gaussian arrangement of the thermometer elements $T_j$ centered about their mean value (with the mean value being, by definition, $T_{ideal}$) which means that many thermometer elements $T_j$ should be close to the mean value, to have a small DNL error, and with the start and end points of the INL characteristic error being zero, a thermometer-code sequence very close to the optimal sequence may be "constructed".

For this purpose, the element with the greatest DNL error must be identified and centered on the ideal INL characteristic or, in an equivalent manner, its $DNL_{worst}$ must be centered at zero.

Particularly, in a preferred aspect, the method provides an adequately accurate approximation (from 0 or the end-of-scale value) of ½ of the DNL error (with opposite sign) of the worst thermometer element, using the elements of the thermometer set having the smallest DNL error.

It shall be noted that an INL error of $DNL_{worst}$ should never be exceeded when constructing the INL characteristic.

Once the worst thermometer element is determined and centered with respect to the Integral Non-Linearity INL characteristic, the second worst element is determined by repeating the procedure, but not starting from 0 (or the end-of-scale value), but from the position defined by the last determined element (the worst element). This will provide the best possible INL performances for this particular DAC.

Particularly, the differential non-linearity DNL error value DNL should be calculated for each thermometer element $T_j$, and the thermometer element $T_j'$ with the highest differential non-linearity DNL error value $DNL_j'$ should be selected.

Once the thermometer element $T_j'$ with the highest error value $DNL_j'$ has been determined, such error value $DNL_j'$ is centered with respect to the ideal conversion characteristic of the converter.

Once such value $DNL_j'$ has been positioned, and in order to reach the value represented by the ideal characteristic, the smallest Differential Non-Linearity DNL error values $DNL_j$ of said plurality of thermometer elements are summed until half the value of said thermometer element $T_j'$ is approximated.

Then, selecting the thermometer element having the highest differential non-linearity DNL error value from the remaining thermometer elements of said plurality of thermometer elements $T_j$ is repeated.

These steps are iterated as many times as there are thermometer elements left, by repeating the selection of the element with the highest differential non-linearity DNL error value $DNL_j$ from the remaining thermometer elements $T_j$ and centering its error value $DNL_j$ with respect to said ideal characteristic, starting from the position defined by the last determined element.

With the above described method, a value of a $k^{th}$ level of the DAC is given by:

$$L_K = \frac{\sum_{j=0}^{j=K-1} T_j}{T_{Tot}}$$

This is advantageous because the output code OUTPUT is generated using the thermometer elements that are closer to the mean value $\mu$, i.e. those of the subset X, as numerators, whereas the thermometer elements that are farther from the mean value are used as denominators.

The above method advantageously provides a process for self-calibration of the SAR-A/D converter which does not require the use of external hardware or other circuit implementations (i.e. on elements that are part of the converter itself), but using the plurality of thermometer elements themselves, and particularly utilizing the binary part for high-accuracy measurement of the errors $E_j$ of the thermometer elements $T_j$.

It should be particularly noted that the binary part of the converter has a small dynamic range but is inherently accurate due to the hardware implementation of binary elements.

Figure 5:
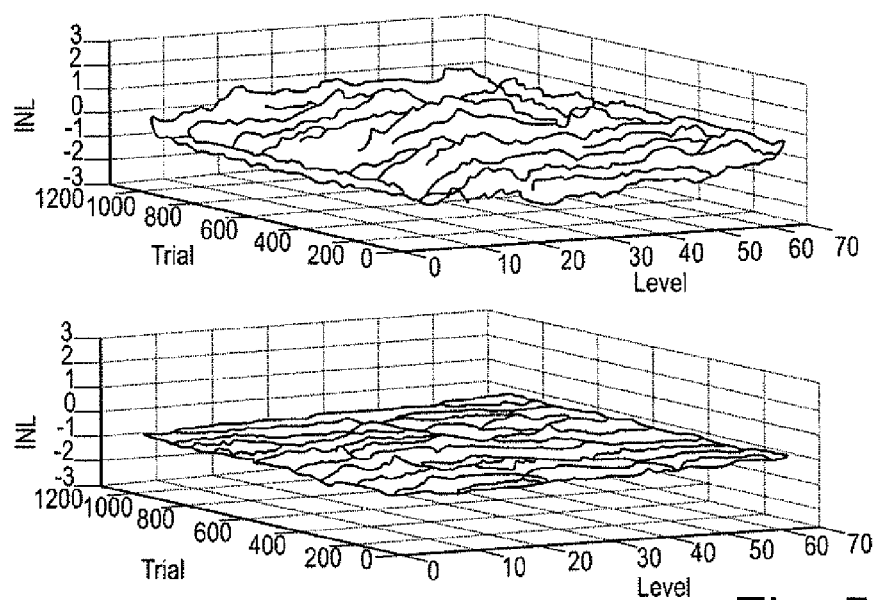
FIGS. 5, 6 and 7 show the result of simulations when a deterministic method is used to solve the method as shown in FIG. 3.
Figure 6:
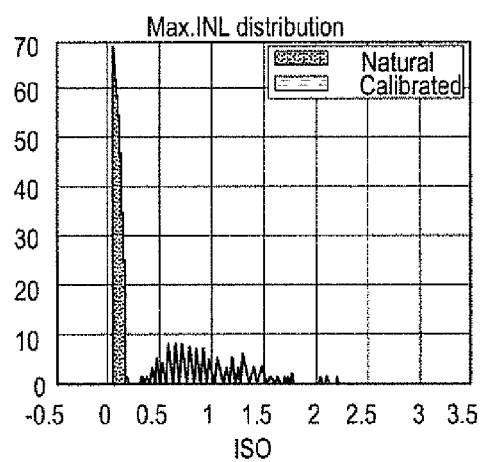
Figure 7:
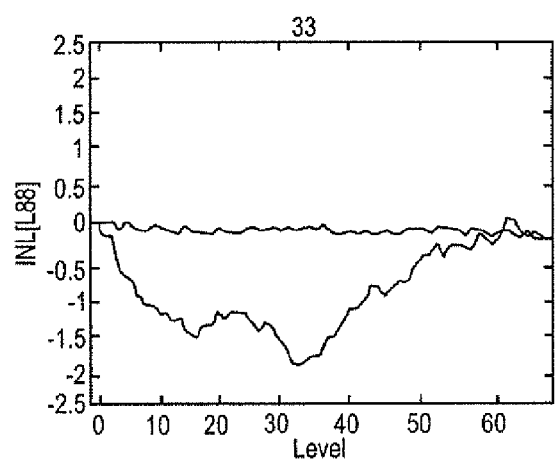

Referring now to FIGS. 5, 6 and 7, there is shown the result of simulations using the above described method.

Particularly, FIG. 5 shows the effect of calibration on 1024 devices, whereas FIG. 6 shows the distribution of the maximum INL error before (natural) and after (calibrated) the calibration method and finally FIG. 7 shows the effect of calibration on a single converter device.

Figure 8:
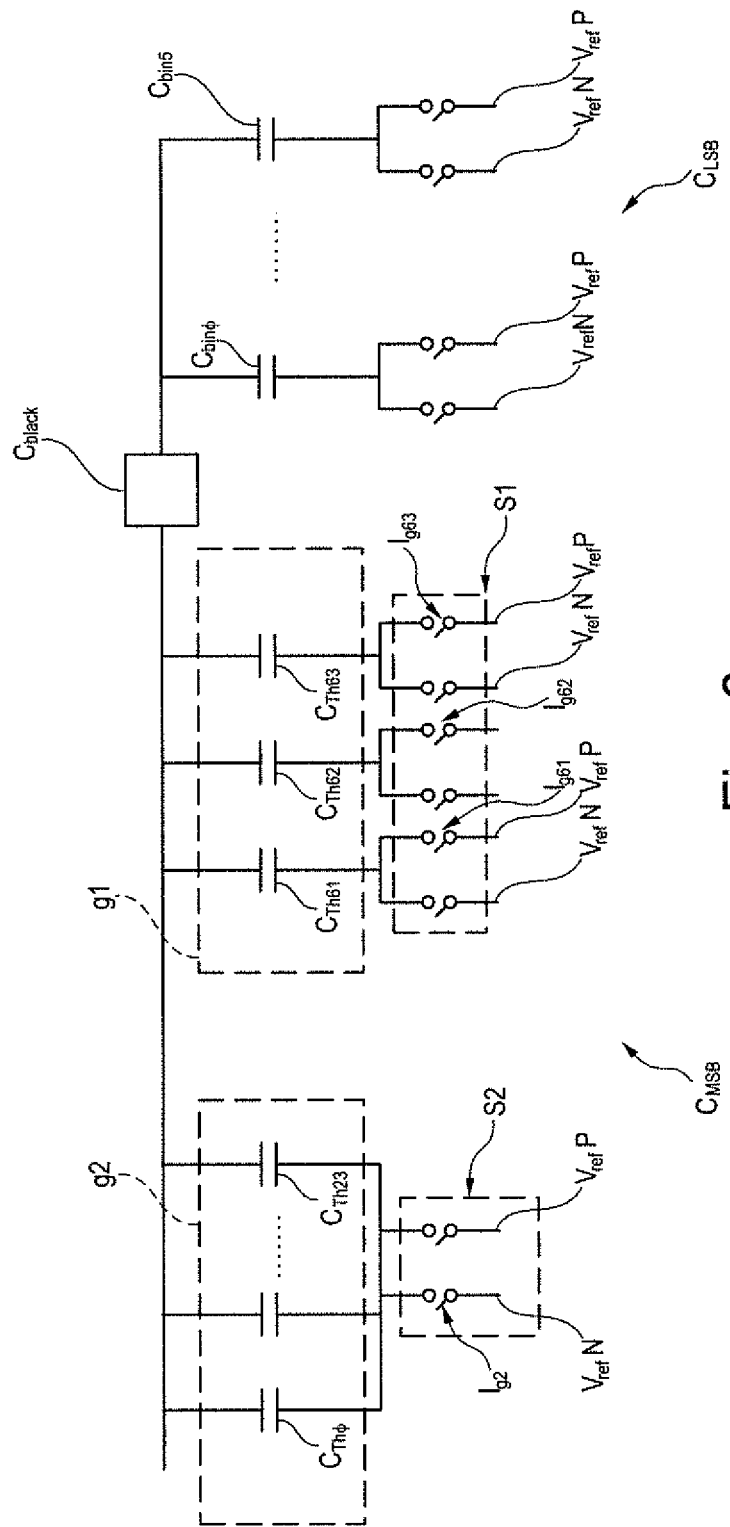
FIG. 8 shows a block diagram of the wiring circuits of thermometer elements and binary-weighted elements as capacitors of the SAR A/D converter of the present invention.

Referring now to FIG. 8, which shows a block diagram of the circuit of thermometer elements and binary-weighted elements as capacitors, it shall be noted that the conversion matrix required to carry out the above described method comprises a first subconverter $C_{MSB}$ comprising a plurality of thermometer elements and a second subconverter $C_{LSB}$ comprising a plurality of binary-weighted elements.

Advantageously, according to the present disclosure, the number of the thermometer elements of the first subconverter $C_{MSB}$ is $2^{N_{BitTh}}$ and the number of the binary-weighted elements of the second subconverter $C_{LSB}$ is $N_{BitBin}$.

In other words, in order to implement the above method, the first subconverter $C_{MSB}$ will comprise a number of thermometer elements equal to $2^{\wedge}N_{bitTh}$, whereas in the prior art it would have been $(2^{\wedge}N_{bitTh})-1$.

Therefore, if there are six thermometer-code bits, the number of thermometer elements that would be used in the prior art would equal to 63 physical elements, whereas in this invention it equals 64 physical elements.

The two subconverters $C_{MSB}$ and $C_{LSB}$, are coupled by an appropriate coupling circuit Cblock.

The coupling circuit Cblock consists, for instance, in a simple wire or a bridge associated with an attenuator capacitor, although a more complex implementation may be also envisaged, and is required to provide the proper scale relationship between the voltages generated by the two subconverters made of capacitors $C_{MSB}$ and $C_{LSB}$.

Particularly, the subconverter $C_{MSB}$ includes as many capacitors as there are thermometer elements, in this case 64, whereas the subconverter $C_{LSB}$ includes as many capacitors as there are binary elements, in this case 6.

In order to minimize the switch area, the converter is designed to comprise first selector S1 which is configured to select a first group G1 of said plurality of thermometer elements $T_j$ and second selector S2 which is configured to select a second group G2 of the plurality $N_{Th}$ of thermometer elements $T_j$.

The first selector S1 comprises a plurality of selector switches $IG1_j$, each in signal communication with a respective thermometer element $T_j$ of the first group G1, which means that each thermometer element may be controlled by a respective switch to a voltage VrefN and VrefP, where VrefP is the positive reference (typically VDD) and VrefN is the negative reference (typically the ground or GND).

The second selector S2 comprises a single selector switch IG2 in signal communication with the thermometer elements $T_j$ of the second group G2 to control all of them at the same time or as a single block. Therefore, this second group G2 of thermometer element can be controlled by the switch IG2 to a voltage VrefN and VrefP, where VrefP is the positive reference (typically VDD) and VrefN is the negative reference (typically the ground or GND).

Preferably, the group G1 comprises a number of thermometer elements that is greater than half the total thermometer elements, whereas the second group G2 comprises the remaining thermometer elements.

For example, assuming a number of 64 thermometer elements (and hence a 6-bit DAC for the thermometer code part), the group G1 comprises 40 thermometer elements (40 being greater than 64/2) and the group G2 comprises 24 elements (because 64 minus 40 is 24).

Particularly, the 40 thermometer elements of the group G1 are controlled individually, whereas the 24 thermometer elements of the group G2 are controlled together or as a single block, whereby 23 switches will be eliminated and the switch area will be reduced.

Assuming the above, a new set of thermometer elements G3 shall be identified, which is composed by the combination of the group G2 and a subset G1' of the group G1, which is identified by a program stored in a memory.

For example, the subset G1' shall comprise eight thermometer elements (G1'=8), in this example 32.

Generally, the subset G1' is equal to the number Nth/2 minus the number of elements of the group G2.

The remaining unit elements G1" of the group G1, i.e. the thermometer elements of G1 minus those of the subset G1' will represent the subset X.

With the above numbers, the remaining thermometer elements G1" which represent the subset X are thirty-two (i.e. Nth/2). The unit thermometer elements of the subset G1', that are included in the subset G3 (G2+G1') have been selected according to the following rules:

removing the worst thermometer elements of the set G1, i.e. the thermometer elements whose values are farthest from the mean value; and minimizing the difference between the set G1" and the set G3.

The value of the set G2 is measured by:

measuring all the unit elements; and measuring the value of the set G2 with respect to any set of unit elements, said set of unit elements having the same nominal total size as G2 and a known error. This measurement may be used to readily assess the value of the large element G2 by comparison with a known set of elements.

Those skilled in the art will obviously appreciate that a number of changes and variants may be made to the method of self-calibration of a SAR-A/D converter as described above to fulfill particular requirements, without departure from the scope of the invention, as defined in the following claims.

The invention claimed is:

1. A method of self-calibration of a successive approximation register-analog to digital (SAR-A/D) converter comprising an N-bit digital-to-analog converter for outputting an N-bit output code, the digital-to-analog converter comprising a first subconverter having a plurality ($N_{Th}$) of thermometer elements and a second subconverter having a plurality of binary-weighted elements $N_{Bin}$, the output code defined by a thermometer scale having a number of levels equal to $N_{Th}$, the method comprising:

measuring, for each thermometer element of the plurality of thermometer elements, an error value;

determining a mean value of the error values;

dividing the plurality of thermometer elements into a first subset (X) and a second subset (Y), each containing an identical number of elements (x, y) equal to $N_{Th}/2$, wherein the first subset (X) comprises the thermometer elements whose error values are closer to the mean value when a sum of the error values of thermometer elements of the first subset (X) is not more than the error value of the thermometer element farthest from the mean value of the first subset (X), and the second subset (Y) comprises the thermometer elements of the plurality of thermometer elements that are not contained in the first subset (X);

generating the thermometer scale, wherein each level $m_i$ of the thermometer scale, with i ranging from 0 to $N_{Th}/2$, is an incremental sum of each error value of the first subset (X), each further level $m_i$ of the thermometer scale, with i ranging from $(N_{Th}/2)+1$ to $N_{Th}$, is the sum of the values of the second subset (Y) plus the incremental sum of the values of the first subset (X); and generating the output code according to the thermometer scale.

2. The method according to claim 1, wherein the first subset (X) is ordered to reduce a maximum error value of an integral non-linearity error of an $R^{th}$ thermometer level.

3. The method according to claim 2, further comprising:

determining an integral non-linearity error value ($INL_R$) of an $R^{th}$ thermometer level of the thermometer elements $T_j$ according to the formula:

$$INL_R = \sum_{j=0}^{R-1} E_j - \frac{R}{N_{Th}} \sum_{j=0}^{N_{Th}-1} E_j$$

where $E_j$ represents relative mismatch differences between the plurality of thermometer elements $T_j$ and a reference thermometer element $T_{ref}$ selected from the plurality of thermometer elements $T_j$ of the first subconverter.

4. The method according to claim 3, wherein the relative mismatch differences $E_j$ of the first subconverter measured according to the formula:

$$E_j = \frac{T_j - T_{ref}}{T_{tot}}, T_{tot} = \sum_{k=0}^{N_{Th}-1} T_k, T_{ref} \in \{T_0 \ldots T_{N_{Th}-1}\}$$

where:
- j ranges from 0 to $N_m - 1$ and represents a number of available thermometer elements; and
- $T_{tot}$ is a total value of the plurality of thermometer elements $T_j$, which total value $T_{tot}$ is calculated using the following formula:

$$T_{tot} = \sum_{k=0}^{N_{Th}-1} T_k = N_{Th} \frac{T_{ref}}{1 - \sum_{j=0}^{j=N_{Th}-1} E_j}.$$

5. The method according to claim 3, wherein the SAR-A/D converter comprises a comparator having an input terminal, and the measuring the relative mismatch differences $E_j$ comprises checking an input voltage on the input terminal of the comparator according the formula:

$$\Delta V = \frac{C_{thX} - C_{thref}}{\Sigma C} * (VrefP - VrefN)$$

where $\Sigma C$ represents a sum of the thermometer elements, $C_{thref}$ is a reference thermometer element, $C_{thx}$ is a thermometer element being measured, $V_{refP}$ is a first reference voltage that is found on the reference thermometer element during sampling and on the thermometer element being measured during the checking, $V_{refN}$ is a second reference voltage that is found on the thermometer element being measured during sampling and on the reference element during the checking, and on the other thermometer elements throughout the conversion and $\Delta V$ is a measurement of the errors $E_j$.

6. The method according to claim 2, wherein the reducing the maximum of the integral non-linearity error value ($INL_R$) of the $R^{th}$ thermometer level comprises:
- identifying a maximum of the error value $INL_R$ for each level R;
- recalculating the error value $INL_R$ for a number of permutations defined beforehand; and
- selecting a permutation that reduces the error value $INL_R$ from the number of permutations.

7. The method according to claim 6, wherein the determining the error value $INL_R$ for each thermometer level R of the thermometer elements $T_j$ comprises:
- calculating, for each of the plurality of thermometer elements $T_j$, the differential non-linearity error value;
- selecting the thermometer element having a highest differential non-linearity error value from the plurality of thermometer elements $T_j$;
- providing an ideal conversion characteristic of a converter;
- using thermometer elements with a smallest differential non-linearity error values of the plurality of thermometer elements until half the error value of the thermometer element is approximated; and
- placing the thermometer element having an error value with respect to the ideal conversion characteristic of the converter.

8. The method according to claim 7, further comprising:
- repeating the selection of the thermometer element having the highest differential non-linearity error value from the remaining thermometer elements of the plurality of thermometer elements $T_j$.

9. The method according to claim 8, wherein the repeating the selection of the thermometer element having the highest differential non-linearity error value from the remaining thermometer elements of the plurality of thermometer elements $T_j$ is repeated as many times as there are thermometer elements.

10. The method according to claim 1, wherein each further level $m_i$ of the thermometer scale, with i ranging from $(N_{Th}/2)+1$ to $N_{Th}$, is equal to a sum of the error values of the second subset (Y) plus the incremental sum of the error values of the first subset (X) in reverse order.

11. The method according to claim 1, wherein the incremental sum of each error value of the first subset (X) is equal to $$\sum_{0}^{J-1} x_k$$

with J ranging from 0 to $N_{th}/2$ where $x_k$ represents each error value in the first subset (X).

12. The method according to claim 1, wherein if the sum of the error values of the first subset (X) is greater than a highest error of each error value of the first subset (X), then at least one value of the second subset (Y) is exchanged with at least one value of the first subset (X) if the sum of the resulting values is smaller than the highest of the error values of a new subset (X) resulting from the exchange.

13. A method of self-calibration of a successive approximation register-analog to digital converter comprising a digital-to-analog (D/A) converter, the D/A converter comprising a first subconverter having a plurality of thermometer elements, a second subconverter having a plurality of binary-weighted elements, a first selector having a plurality of switches, and a second selector having at least one switch, the method comprising:
- measuring, for each thermometer element of the plurality of thermometer elements, an error value;
- determining a mean value of the error values;
- operating the first selector to select a first group of the plurality of thermometer elements whose error values are closer to the mean value when a sum of the error values of the thermometer elements of the first group is not more than the error value of the thermometer element farthest from the mean value of the first group; and
- operating the second selector to select a second group of the plurality of thermometer elements that are not contained in the first group.

14. The method according to claim 13, wherein the first group comprises a number of thermometer elements that is greater than the number of thermometer elements contained in the second group.

15. The method according to claim 13, wherein a number of the thermometer elements of the first subconverter is 2^(number of thermometer bits), and a number of the binary-weighted elements of the second subconverter is equal to a number of binary bits.

16. A digital-to-analog (D/A) converter comprising:
- a first subconverter having a plurality of thermometer elements and configured to determine a mean value of error values of the plurality of thermometer elements;
- a second subconverter having a plurality of binary-weighted elements;
- a first selector configured to select a first group of said plurality of thermometer elements whose error values are closer to the mean value when a sum of the error values of the thermometer elements of the first group is not more than the error value of the thermometer element farthest from the mean value of the first group;
- a second selector configured to select a second group of said plurality of thermometer elements;
- said first selector comprising a plurality of selector switches each coupled with a respective thermometer element of said first group; and
- said second selector comprising at least one selector switch coupled with the thermometer elements of said second group.

17. The D/A converter according to claim 16, wherein said first group comprises a number of thermometer elements that is greater than the number of thermometer elements contained in said second group.

18. The D/A converter according to claim 16, wherein a number of said thermometer elements of said first subconverter is 2^(number of thermometer bits), and a number of the binary-weighted elements of the second subconverter is equal to a number of binary bits.

* * * * *